United States Patent
Gousev et al.

(10) Patent No.: US 6,958,506 B2
(45) Date of Patent: Oct. 25, 2005

(54) HIGH-DIELECTRIC CONSTANT INSULATORS FOR FEOL CAPACITORS

(75) Inventors: Evgeni P. Gousev, Mahopac, NY (US); Harald F. Okorn-Schmidt, Putnam Valley, NY (US); Arne W. Ballantine, Round Lake, NY (US); Douglas A. Buchanan, Cortlandt Manor, NY (US); Eduard A. Cartier, Leuven (BE); Douglas D. Coolbaugh, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/688,508

(22) Filed: Oct. 17, 2003

(65) Prior Publication Data

US 2004/0087100 A1 May 6, 2004

Related U.S. Application Data

(62) Division of application No. 10/246,110, filed on Sep. 18, 2002, now Pat. No. 6,667,207, which is a division of application No. 09/882,749, filed on Jun. 15, 2001, now Pat. No. 6,511,873.

(51) Int. Cl.$^7$ .................. H01L 27/108; H01L 29/76; H01L 29/94; H01L 31/119
(52) U.S. Cl. .................. 257/296; 257/303; 257/370
(58) Field of Search .................. 257/295, 296, 257/303, 306, 310, 370, 378

(56) References Cited

U.S. PATENT DOCUMENTS

| | | | |
|---|---|---|---|
| 4,835,112 | A | 5/1989 | Pfiester et al. |
| 5,330,931 | A | 7/1994 | Emesh et al. |
| 5,335,138 | A | 8/1994 | Sandhu et al. |
| 5,381,302 | A | 1/1995 | Sandhu et al. |
| 5,452,178 | A | 9/1995 | Emesh et al. |
| 5,563,762 | A | 10/1996 | Leung et al. |
| 5,633,181 | A | 5/1997 | Hayashi |
| 5,789,303 | A | 8/1998 | Leung et al. |
| 5,846,867 | A | 12/1998 | Gomi et al. |
| 5,943,564 | A | 8/1999 | Chen et al. |
| 5,970,333 | A | 10/1999 | Gris et al. |
| 6,093,944 | A | 7/2000 | VanDover |
| 6,156,594 | A | 12/2000 | Gris |
| 6,255,122 | B1 | 7/2001 | Duncombe et al. |
| 6,682,969 | B1 * | 1/2004 | Basceri et al. ............ 438/240 |
| 6,800,921 | B1 * | 10/2004 | Coolbaugh et al. ......... 257/532 |

OTHER PUBLICATIONS

U.S. Appl. No. 09/225,526, filed Jan. 4, 1999.

U.S. Appl. No. 09/757,154, filed Jan. 9, 2001.

U.S. Appl. No. 09/300,185, filed Apr. 27, 1999.

* cited by examiner

*Primary Examiner*—Hoai Pham
(74) *Attorney, Agent, or Firm*—William D. Sabo

(57) ABSTRACT

Methods of forming front-end-of the line (FEOL) capacitors such as polysilicon-polysilicon capacitors and metal-insulator-silicon capacitors are provided that are capable of incorporating a high-dielectric constant (k of greater than about 8) into the capacitor structure. The inventive methods provide high capacitance/area devices with low series resistance of the top and bottom electrodes for high frequency responses. The inventive methods provide a significant reduction in chip size, especially in analog and mixed-signal applications where large areas of capacitance are used.

8 Claims, 3 Drawing Sheets

HIGH-DIELECTRIC CONSTANT INSULATORS FOR FEOL CAPACITORS

REFERENCE TO RELATED APPLICATION

This application is a divisional of application Ser. No. 10/246,110 filed Sep. 18, 2002, now issued as U.S. Pat. No. 6,667,207, which is a divisional of application Ser. No. 09/882,749 filed Jun. 15, 2001, now issued as U.S. Pat. No. 6,511,873.

FIELD OF THE INVENTION

The present invention relates to semiconductor devices, and more particularly to front-end-of the line (FEOL) capacitors such as polysilicon-polysilicon, i.e., poly-poly, capacitors and metal-insulator-silicon (MIS) capacitors that include Si-containing electrodes and a high-dielectric constant, i.e., high-k, dielectric material having a dielectric constant of greater than about 8.0. The present invention also provides methods for fabricating the inventive FEOL capacitors, which optimize the capacitance per unit area of the device. This optimization, in turn, allows for a significant reduction in semiconductor chip size.

BACKGROUND OF THE INVENTION

Dielectric materials in high-density circuits appear as capacitors in dynamic random access memory (DRAM) applications, gate dielectrics in transistors and as decoupling capacitors. The dielectric in these structures is typically silicon dioxide, i.e., $SiO_2$, silicon nitride, i.e., $Si_3N_4$, or any combinations thereof. These dielectrics have a relative dielectric constant, i.e., k, of about 8.0 or below.

In the case of capacitors, the main focus is on the development of high capacitance/area devices with low series resistance of the top and bottom electrodes for high frequency responses. High capacitance/area devices require the use of dielectric materials that are thin (on the order of about 200 Å or less). The use of conventional, thin low-k dielectrics in today's devices is undesirable since such materials lead to leaky devices. Moreover, as conventional chemical vapor deposited and thermal low-k dielectrics become thinner, it is increasingly becoming more difficult to meet reliability limitations. Therefore, alternatives to conventional, thin low-k dielectrics that do not exhibit the above-mentioned leakage problem are continually being sought in the semiconductor industry.

In the case of FEOL capacitors such as poly-poly capacitors and MIS capacitors, the integration of high-k dielectrics (k of greater than about 8) into the capacitor structure is difficult because of the high-deposition temperatures (typically greater than 600° C.) used in depositing the high-k dielectric onto the silicon-containing electrode. At such high-deposition temperatures, interfacial layers form in the silicon layer which may degrade device performance. In addition, grain boundary leakage paths and lowered barrier heights may result which could lead to devices that are highly unreliable.

In view of the above drawbacks in the prior art, there is a need for fabricating FEOL capacitors that have a high capacitance/area with low series resistance of the top and bottom electrodes. Moreover, there is a need for developing FEOL capacitors that contain a thin high-k dielectric which has improved reliability, leakage currents and stability as compared with prior art FEOL capacitors.

SUMMARY OF THE INVENTION

One object of the present invention is to provide FEOL capacitors such as poly-poly capacitors and MIS capacitors that have a high capacitance/area with low series resistance top and bottom electrodes for high frequency responses.

Another object of the present invention is to provide FEOL capacitors containing a thin high-k dielectric that does not lead to leakage problems and device unreliability.

A further object of the present invention is to provide FEOL capacitors using a method that is easy to implement in existing BiCMOS (bipolar complementary metal oxide semiconductor) processing schemes.

A yet further object of the present invention is to provide FEOL capacitors utilizing methods which allow for significant reduction in chip size, which is especially important in analog and mixed-signal applications where large areas of capacitance are used.

These and other objects and advantages are achieved in the present invention by utilizing the following two methods which both include the formation of a high-k dielectric onto a Si-containing bottom electrode and the formation of a highly doped (on the order of about 1E19 atoms/cm$^3$ or greater) Si-containing top electrode.

Specifically, in one aspect of the present invention, a MIS capacitor is provided utilizing a BiCMOS or CMOS integration scheme which includes the steps of:

(a) implanting a bottom electrode into a surface of a Si-containing substrate;

(b) forming a high-k dielectric over at least a portion of said bottom electrode, said high-k dielectric having a dielectric constant of greater than about 8.0; and (c) forming a doped Si-containing electrode over said high-k dielectric, wherein said doped Si-containing electrode comprises an intrinsic base polysilicon layer of a bipolar device.

The above-mentioned method forms a MIS capacitor integrated with a bipolar device which includes an implanted bottom electrode formed in a surface of a Si-containing substrate; a high-k dielectric having a dielectric constant of greater than about 8 formed on a portion of said implanted bottom electrode; and a doped Si-containing electrode formed on said high-k dielectric, wherein said doped Si-containing electrode comprises an intrinsic base polysilicon layer of a bipolar device.

Another aspect of the present invention relates to a method of fabricating a poly-poly capacitor utilizing a BiCMOS processing scheme which includes the steps of:

(a) forming a base polysilicon layer over at least isolation regions;

(b) forming a high-k dielectric over at least a portion of said isolation regions, wherein said high-k dielectric has a dielectric constant of greater than about 8.0; and (c) forming a doped Si-containing electrode over said high-k dielectric, wherein said doped Si-containing electrode comprises an intrinsic base polysilicon layer of a bipolar device.

The above-mentioned steps result in a poly-poly capacitor that comprises a bottom polysilicon electrode formed over isolation regions that are present in a Si-containing substrate; a high-k dielectric having a dielectric constant of greater than about 8 formed on a portion of said bottom electrode; and a doped Si-containing electrode formed on said high-k dielectric, wherein said doped Si-containing electrode comprises an intrinsic base polysilicon layer of a bipolar device.

In both aspects mentioned above, the top Si-containing electrode, which is also the intrinsic base polysilicon layer of a bipolar device, may be comprised of poly SiGe.

DETAILED DESCRIPTION OF THE INVENTION

Figure 1A:
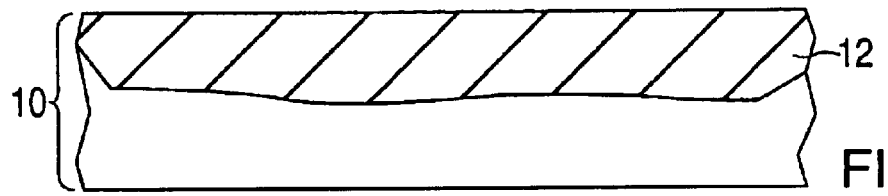
FIGS. 1A–E are cross-sectional views of the inventive MIS capacitor through various processing steps of the present invention.

The present invention, which provides FEOL capacitors containing high-k dielectrics, will now be described in more detail by referring to the drawings that accompany the present application. It is noted that in the accompanying drawings, like and/or corresponding elements are referred to by like reference numerals. It is also noted that the drawings show only the portion of the device in which the FEOL capacitors are to be formed. The bipolar device region and the region containing the device transistors are not shown for simplicity. However, as one skilled in the art is aware the bipolar devices and device transistors may be formed in areas that abut the capacitor area depicted in the drawings.

Reference is first made to FIGS. 1A–E which illustrate the formation of the inventive MIS capacitor structure. Specifically, FIG. 1A shows a portion (i.e., the area of the device in which the FEOL capacitor is to be formed) of Si-containing substrate 10 after the formation of bottom electrode 12 into a surface of the Si-containing substrate. The structure shown in FIG. 1A is composed of conventional materials well known to those skilled in the art and conventional BiCMOS or CMOS processing steps are used in forming the same.

For example, Si-containing substrate 10 includes any Si-containing semiconducting material such as Si, SiGe, Si/Si, Si/SiGe, polysilicon, silicon-on insulators (SOIs) or combinations thereof such as a layer of polysilicon formed on a Si substrate. Preferred Si-containing substrates are Si and polysilicon substrates. The Si-containing substrate may include various active devices and/or isolation regions formed therein. For clarity, the active devices and/or isolation regions are not shown in FIG. 1A, but are meant to be included by reference numeral 10. The Si-containing substrate may of the p- or n-type depending on the type of devices being fabricated thereon.

In the embodiment shown in FIG. 1A, bottom electrode 12 is formed in Si-containing substrate 10 by utilizing a conventional high-dose reach-thru implantation process which is typically employed in BiCMOS processes to form the reach through region of the bipolar structure. This implant may be followed by a conventional activation annealing process, or, alternatively, the activation annealing process may be performed at a later stage of the inventive method wherein a single annealing step is employed in activating the bottom and top electrodes of the capacitor as well as any other diffusion regions that may-be present in the structure. Activating all the implanted regions using a single annealing process is highly preferred in the present invention since it lowers the thermal budget of the overall process.

The high-dose reach-thru implant is performed by implanting n- or p-type dopants at a dosage which is capable of forming a highly doped region having a dopant concentration of about 1E19 atoms/cm$^3$. The conditions used during the implant process are conventional and are well known to those skilled in the art.

As stated above, following the implantation process, the implant region may be subjected to an activation annealing process which is typically carried out in an inert gas such as He, Ar, or N$_2$ or a forming gas. The activation annealing may be carried out using conventional rapid thermal annealing (RTA) or conventional furnace annealing, and a single temperature or various ramp and soak cycles may be employed. It is again emphasized that this activation annealing step may be performed after formation of the top electrode.

Figure 1B:
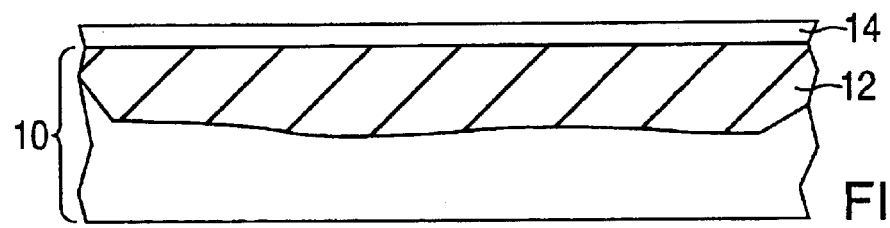
Figure 1C:
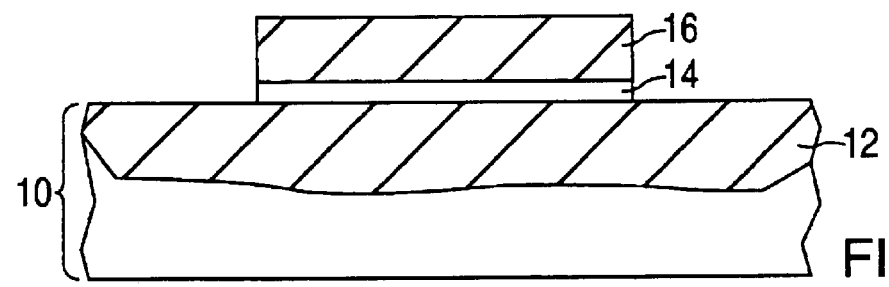

Next, and as shown in FIG. 1B, high-k dielectric 14 is formed over at least a portion of bottom electrode 12. The term "high-k" as used herein denotes a dielectric that has a dielectric constant of greater than about 8, preferably from about 10 to about 50. It is noted that all the dielectric constants reported herein are relative to a vacuum, unless otherwise stated.

A wide variety of high-k dielectrics may be employed in the present invention including, but not limited to: binary metal oxides such as TiO$_2$, Ta$_2$O$_5$, Al$_2$O$_3$, Y$_2$O$_3$, ZrO$_2$, HfO$_2$, Gd$_2$O$_3$, and La$_2$O$_3$; silicates, aluminates and oxynitrides of said binary metal oxides; and perovskite-type oxides. Combinations and/or multilayers of such high-k dielectrics are also contemplated herein. The perovskite-type oxides may be in the crystalline or amorphous phase.

Examples of perovskite-oxides that may be employed in the present invention as the high-k dielectric material include, but are not limited to: a titanate system material, i.e., barium titanate, strontium titanate, barium strontium titanate, lead titanate, lead zirconate titanate, lead lanthanum zirconate titanate, barium zirconium titanate and barium lanthanum titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, and barium titanium niobate; or a Bi-layered perovskite system material such as strontium bismuth tantalate, and bismuth titanate.

Of the various high-k dielectrics mentioned above, preference is given to binary oxides or aluminate high-k materials. A highly preferred binary oxide employed in the present invention is Al$_2$O$_3$.

The high-k dielectric material of the present invention is formed utilizing any conventional deposition process, including, but not limited to: low-pressure chemical vapor deposition (LPCVD), atomic layer chemical vapor deposition (ALCVD), rapid thermal chemical vapor deposition (RTCVD), plasma-assisted CVD, physical vapor deposition, sputtering, plating, evaporation, chemical solution deposition and other like deposition processes. In some embodiments of the present invention, the high-k dielectric is deposited directly on silicon. The high-k layer can also be deposited on an ultra-thin (on the order of about 20 Å or less) interlayer composed of an oxide such as SiO$_2$, nitride such as Si$_3$N$_4$ or combinations thereof. In those embodiments, it is highly preferred that the deposition of the high-k dielectric be carried out temperatures below 600° C.

The physical thickness of the high-k dielectric material employed in the present invention may vary depending on the dielectric constant and the deposition process used in forming the same. Typically, however, the high-k dielectric has a physical thickness of from about 50 to about 1000 Å, with a thickness of from about 100 to about 400 Å being more highly preferred.

In some embodiments of the present invention, the high-k deposition step may be followed by a postdeposition anneal to improve the properties of the high-k layer. Both conventional furnace annealing and rapid thermal annealing can be utilized.

Following deposition of the high-k dielectric, the high-k dielectric material may be optionally patterned using conventional lithography and etching. The lithography step includes applying a photoresist, patterning the photoresist and developing the pattern. The etching step includes any conventional dry etch process such as reactive-ion etching, ion-beam etching and plasma etching. Note that this patterning step may be performed at a later step of the present invention, i.e., after formation of the top electrode.

Following formation of the patterned or unpatterned high-k dielectric, top electrode (sometimes referred to herein as just the doped Si-containing electrode) 16 is formed over high-k dielectric 14. In accordance with the present invention, top electrode 16 (see FIG. 1C) is composed of a highly doped polysilicon layer which may include poly SiGe. The term "highly doped" denotes a dopant concentration (n or p-type) of about 1E19 atoms/cm$^3$ or greater. High dopant concentrations are employed to provide minimum series resistance to the top electrode. It is noted that the top electrode material is composed of same material as the intrinsic base layer of abutting bipolar devices.

The top electrode may be formed by a conventional deposition process followed by ion implantation, or alternatively by an in-situ doping deposition process. Following the formation of the doped top electrode, the structure may be annealed using the conditions mentioned above. The thickness of the top electrode may vary and is not critical to the present invention.

Following the activation of the devices, the top electrode and the high-k dielectric may be optionally patterned utilizing the patterning process mentioned above, i.e., lithography and etching. In some embodiments of the present invention, an amorphization step is performed on the structure prior to etching. The amorphization step includes conventional processes such as ion implantation.

Figure 1D:
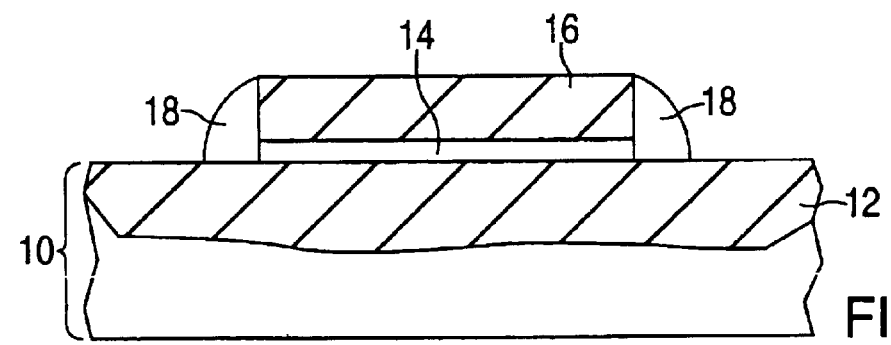

FIG. 1D shows an alternative embodiment of the present invention wherein optional spacers 18 are formed on exposed sidewalls of the patterned high-k dielectric and patterned top electrode. Optional spacers 18 are composed of an insulating material such as an oxide or nitride, and are formed by conventional processes well known to those skilled in the art. For example, a RTCVD process may be employed in the present invention in forming optional spacers 18.

Figure 1E:
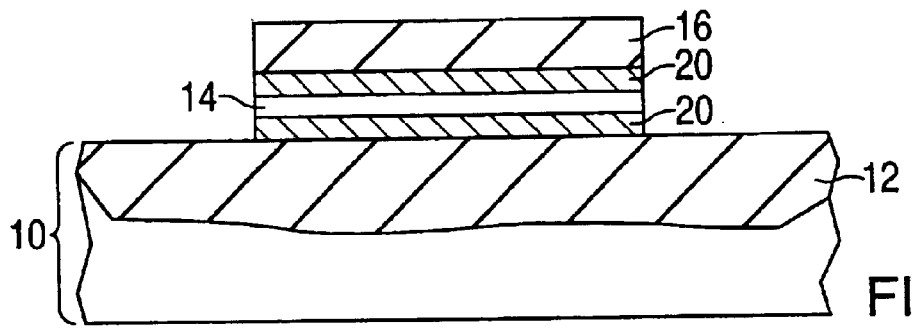

The present invention also contemplates the formation of diffusion barrier layer 20 either below and/or on top of the high-k dielectric material. That is, an optional diffusion barrier layer may be formed on the bottom electrode and/or on the high-k dielectric. FIG. 1E shows an embodiment of the present invention wherein diffusion barrier layer 20 is formed on bottom electrode 12 and on top of high-k dielectric 14. Note that the structure shown in FIG. 1E is after patterning.

The optional diffusion barrier layer is composed of an oxide, nitride or oxynitride and, when present, it typically has a thickness of from about 0.5 to about 2 nm. The optional diffusion barrier layer is formed by conventional processes such as deposition or thermal oxidation, nitridation or oxynitridation. Suitable deposition processes that can be employed in the present invention in forming the optional diffusion barrier layer include, but are not limited to: chemical vapor deposition (CVD), RTCVD, plasma enhanced chemical vapor deposition (PECVD) and other like deposition processes. The presence of the optional barrier layer in the inventive MIS capacitor improves interface quality, thermal stability and diffusion barrier properties of the structure.

Reference is now made to FIGS. 2A–E which show the basic processing steps that are employed in forming the poly-poly capacitor of the present invention. The inventive process begins by forming bottom electrode 12 over at least a portion of isolation region 22 that is formed in Si-containing substrate 10 so as to provide the structure shown in FIG. 2A.

Figure 2A:
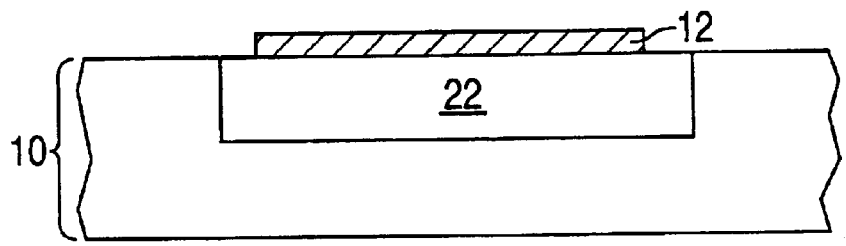
FIGS. 2A–E are cross-sectional views of the inventive poly-poly capacitor through various processing steps of the present invention.

The structure shown in FIG. 2A is formed utilizing conventional materials and processing steps that are well known to those skilled in the art. For example, isolation regions 22 may be LOCOS isolation regions or trench isolation regions. When LOCOS isolation regions are employed in the present invention, a conventional local oxidation of silicon process is employed in forming the same. When isolation trench regions are employed in the present invention, the isolation trench regions are formed by the following processing steps that include: forming trenches in the Si-containing substrate utilizing lithography and etching; lining said trenches with a dielectric liner material such as an oxide; and filling the lined trenches with a trench dielectric material such as TEOS (tetraethylorthosilicate). If needed, the filled trenches may be densified utilizing conventional processes well known to those skilled in the art and a conventional planarization process such as chemical-mechanical polishing (CMP) may also be employed.

The bottom electrode of the poly-poly capacitor which comprises a base polysilicon layer of the bipolar device is formed utilizing a conventional deposition process such as CVD, plasma-assisted CVD, sputtering, evaporation, chemical solution deposition and other like deposition processes. In one embodiment of the present invention, the bottom electrode is composed of poly SiGe. The base polysilicon layer in the capacitor region is then doped utilizing a conventional source/drain implantation process using implant conditions that are well known to those skilled in the art. Note that this implant occurs after the bipolar devices have been formed.

Figure 2B:
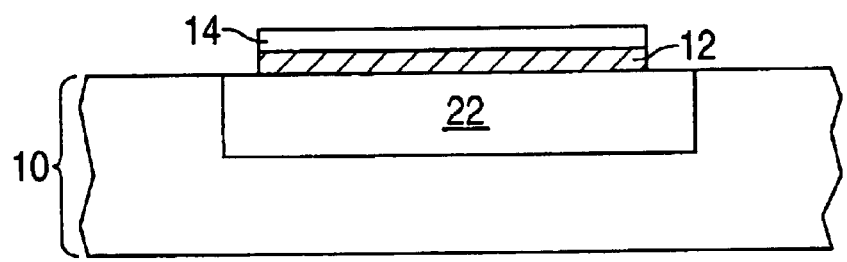

After a conventional activation annealing process as mentioned above is performed, high-k dielectric 14 is formed over at least a portion of bottom electrode 12 providing the structure illustrated by FIG. 2B. Note that the various materials and processes mentioned above in the case of the MIS capacitor are used here to form the high-k dielectric of the poly-poly capacitor.

Figure 2C:
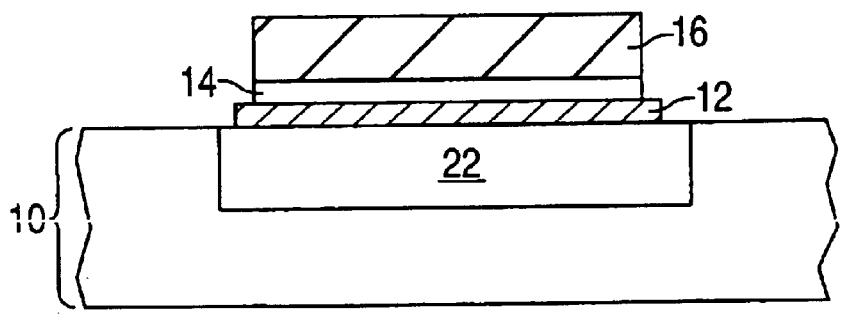

FIG. 2C shows the formation of top electrode 16 on the high-k dielectric and the resultant structure that is obtained. Note that the description made above in regard to the top electrode of the MIS capacitor is also applicable here for the top electrode of the poly-poly capacitor; therefore that description is incorporated herein by reference. As was the case with the MIS capacitor, the top electrode of the poly-poly capacitor may be composed of poly SiGe.

Figure 2D:
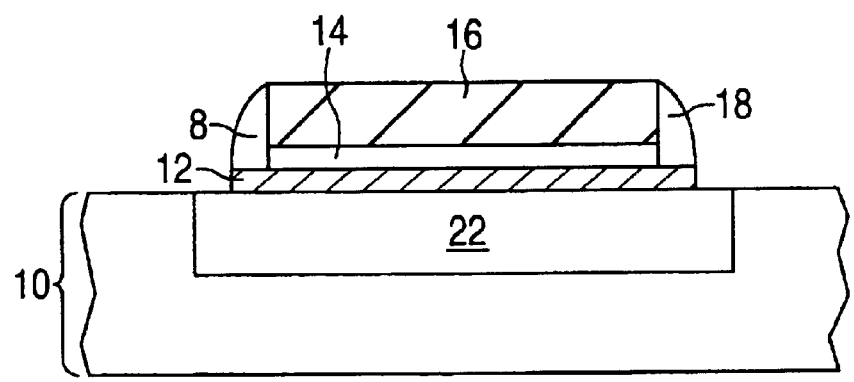
Figure 2E:
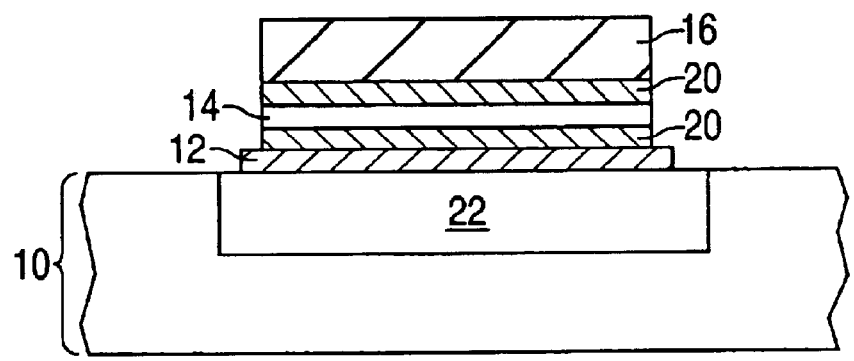

FIG. 2D illustrates the poly-poly capacitor structure of FIG. 2C which now contains optional spacers 18 on exposed edges of the patterned capacitor. As was the case with the MIS capacitor, an amorphization step may be employed in this embodiment prior to etching the high-k dielectric and top electrode.

In the poly-poly capacitor, optional diffusion barrier 20 as mentioned above may be formed either below and/or on top of the high-k dielectric layer. FIG. 2D illustrates a structure in which optional diffusion barrier layer 20 is formed on bottom electrode 12 as well as on top of high-k dielectric 14.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to exact forms and details described and illustrated, but fall within the scope of the appended claims.

What is claimed is:

1. A poly-poly capacitor comprising a bottom polysilicon electrode formed over an isolation region that is present in a Si-containing substrate; a high-k dielectric having a dielectric constant of greater than about 8 formed on a portion of said bottom electrode; and a doped Si-containing electrode formed on said high-k dielectric, wherein said bottom electrode, said high-k dielectric and a portion of said doped Si-containing electrode form a capacitor and another portion of said doped Si-containing electrode comprises an intrinsic base layer of an abutting bipolar device.

2. The poly-poly capacitor of claim 1 wherein said bottom polysilicon electrode is composed of poly SiGe.

3. The poly-poly capacitor of claim 1 wherein said high-k dielectric is a binary metal oxide, silicate, aluminate or oxynitride of a binary metal oxide, or a perovskite oxide.

4. The poly-poly capacitor of claim 3 wherein said high-k dielectric is a binary metal oxide or an aluminate of a binary metal oxide.

5. The poly-poly capacitor of claim 4 wherein said high-k dielectric is $Al_2O_3$.

6. The poly-poly capacitor of claim 1 wherein said doped Si-containing electrode is comprised of poly SiGe.

7. The poly-poly capacitor of claim 1 wherein spacers are present on any exposed sidewalls of said high-k dielectric and said doped Si-containing electrode.

8. The poly-poly capacitor of claim 1 wherein a diffusion barrier layer is present between said bottom electrode and said high-k dielectric, between said high-k dielectric and said doped Si-containing electrode, or between said bottom electrode and said high-k dielectric and between said high-k dielectric and said doped Si-containing electrode.

* * * * *